United States Patent
Kim et al.

(10) Patent No.: US 11,456,851 B2
(45) Date of Patent: Sep. 27, 2022

(54) PHASE INTERPOLATION BASED CLOCK DATA RECOVERY CIRCUIT AND COMMUNICATION DEVICE INCLUDING THE SAME

(71) Applicant: SAMSUNG ELECTRONICS CO., LTD., Suwon-si (KR)

(72) Inventors: Hanseok Kim, Seoul (KR); Hobin Song, Daejeon (KR); Jaehyun Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/469,062

(22) Filed: Sep. 8, 2021

(65) Prior Publication Data
US 2022/0209930 A1    Jun. 30, 2022

(30) Foreign Application Priority Data
Dec. 24, 2020    (KR) .................... 10-2020-0183067

(51) Int. Cl.
| | |
|---|---|
| H04L 7/00 | (2006.01) |
| H03L 7/093 | (2006.01) |
| H03L 7/08 | (2006.01) |
| H04L 7/033 | (2006.01) |

(52) U.S. Cl.
CPC .......... *H04L 7/0025* (2013.01); *H03L 7/0807* (2013.01); *H03L 7/093* (2013.01); *H04L 7/0331* (2013.01)

(58) Field of Classification Search
CPC ... H04L 7/0025; H04L 7/0331; H03L 7/0807; H03L 7/093
See application file for complete search history.

(56) References Cited

U.S. PATENT DOCUMENTS

| | | |
|---|---|---|
| 6,292,507 B1 | 9/2001 | Hardin et al. |
| 7,853,430 B2 | 12/2010 | Nakadaira |
| 8,289,032 B2 | 10/2012 | Lee et al. |
| 8,415,996 B1 | 4/2013 | Wong |
| 8,792,535 B2 | 7/2014 | Nakadaira |
| 9,035,683 B2 | 5/2015 | Yang et al. |
| 9,178,691 B2 | 11/2015 | Shimizu et al. |
| 9,485,082 B1 * | 11/2016 | Sun ........................ H03L 7/0807 |
| 9,596,074 B2 | 3/2017 | Tan |
| 9,960,774 B2 | 5/2018 | Amirkhany et al. |

(Continued)

*Primary Examiner* — Freshteh N Aghdam
(74) *Attorney, Agent, or Firm* — Sughrue Mion, PLLC

(57) ABSTRACT

A clock data recovery circuit includes a phase locked loop (PLL), a code signal generator, and a clock and data generator. The PLL generates a plurality of reference clock signals of which frequencies are modulated. Each of the plurality of reference clock signals has a first profile that is periodically fluctuated. The code signal generator generates a first compensation code signal. The first compensation code signal has a second profile that is periodically fluctuated and is different from the first profile. The clock and data generator generates a recovered data signal by sampling an input data signal based on a clock signal, compensates a frequency modulation on the plurality of reference clock signals based on the first compensation code signal, and includes a phase interpolator that generates the clock signal based on the plurality of reference clock signals and the first compensation code signal.

20 Claims, 15 Drawing Sheets

(56) References Cited

U.S. PATENT DOCUMENTS

| | | |
|---|---|---|
| 10,224,937 B1 | 3/2019 | Wu et al. |
| 10,425,123 B2 | 9/2019 | Srivastava |
| 2008/0260071 A1* | 10/2008 | Sidiropoulos ......... H03L 7/0998 375/376 |
| 2009/0129524 A1* | 5/2009 | Chen .................... H03L 7/1976 375/376 |
| 2011/0019718 A1* | 1/2011 | Chiang ................. H04B 14/06 375/376 |
| 2011/0064176 A1* | 3/2011 | Takada .................... H03L 7/07 375/355 |
| 2011/0274143 A1* | 11/2011 | Anidjar ................... H04B 1/69 375/376 |
| 2013/0329843 A1* | 12/2013 | Takeuchi ................ H03L 7/085 375/375 |
| 2014/0139266 A1* | 5/2014 | Kenney ................... H03L 7/07 327/156 |
| 2015/0263848 A1 | 9/2015 | Mobin et al. |
| 2017/0180112 A1* | 6/2017 | Hsieh ....................... H03L 7/18 |

\* cited by examiner

FIG. 6A

| INTERVAL | T1 | | T2 | | ... |
|---|---|---|---|---|---|
| | TS11 | TS12 | TS21 | TS22 | |
| SLOPE | S1 | S2 | S1 | S2 | ... |

FIG. 6B

| INTERVAL | TS1 | TS2 |
|---|---|---|
| SLOPE | S1 | S2 |

FIG. 6C

| INTERVAL | TS |
|---|---|
| SLOPE | S1 |

PHASE INTERPOLATION BASED CLOCK DATA RECOVERY CIRCUIT AND COMMUNICATION DEVICE INCLUDING THE SAME

CROSS-REFERENCE TO RELATED APPLICATION

This application claims priority under 35 USC § 119 to Korean Patent Application No. 10-2020-0183067 filed on Dec. 24, 2020 in the Korean Intellectual Property Office (KIPO), the contents of which are herein incorporated by reference in their entirety.

BACKGROUND

1. Technical Field

Example embodiments relate generally to semiconductor integrated circuits, and more particularly to clock data recovery circuits implemented based on phase interpolation, and communication devices including the clock data recovery circuits.

2. Description of the Related Art

In high-speed data communication, a communication system may transmit a data signal without a separate clock signal. If a separate clock signal is not used at a receiver side of communication system, a clock data recovery (CDR) circuit may be used to extract clock information from a received data signal. A controller such as a microprocessor, FPGA, or custom hardware chip associated with the receiver may be used to control the CDR circuit. Once clock information is extracted, the recovered clock may be used to re-time and re-generate original data. Recently, phase interpolation may be used for the clock data recovery circuit to generate a clock having phase ranges between the phases of two input clocks, which have phases different from each other.

In addition, in high-speed data communication, spread spectrum clocking (SSC) may be employed to reduce electromagnetic interference (EMI). The spread spectrum clocking may, for example, modulate a clock frequency with a triangular waveform, e.g., apply a triangle wave frequency modulation to a clock signal. The spread spectrum clocking may intentionally fluctuate the frequency of the clock, thereby preventing energy to be concentrated on a particular frequency, which may cause the electromagnetic interference to reduce noise.

SUMMARY

At least one example embodiment of the present disclosure provides a clock data recovery circuit implemented based on phase interpolation and capable of removing self-generated spread spectrum clocking.

At least one example embodiment of the present disclosure provides a communication device including the clock data recovery circuit.

Provided herein is a clock data recovery circuit based on phase interpolation, the clock data recovery circuit including: a phase locked loop (PLL) configured to generate a plurality of reference clock signals of which frequencies are modulated based on a first start signal, each of the plurality of reference clock signals having a first profile that is periodically fluctuated; a code signal generator configured to generate a first compensation code signal based on a second start signal, the first compensation code signal having a second profile that is periodically fluctuated and is different from the first profile; and a clock and data generator configured to generate a recovered data signal by sampling an input data signal based on a clock signal, and to compensate a frequency modulation on the plurality of reference clock signals based on the first compensation code signal. The clock and data generator includes a phase interpolator configured to generate the clock signal based on the plurality of reference clock signals and the first compensation code signal.

According to example embodiments, a communication device includes a clock data recovery circuit that receives an input data signal provided through a communication channel. The clock data recovery circuit includes a phase locked loop (PLL), a code signal generator, and a clock and data generator. The phase locked loop generates a plurality of reference clock signals of which frequencies are modulated based on a first start signal. Each of the plurality of reference clock signals has a first profile that is periodically fluctuated. The code signal generator generates a first compensation code signal based on a second start signal. The first compensation code signal has a second profile that is periodically fluctuated and is different from the first profile. The clock and data generator generates a recovered data signal by sampling the input data signal based on a clock signal, compensates a frequency modulation on the plurality of reference clock signals based on the first compensation code signal, and includes a phase interpolator that generates the clock signal based on the plurality of reference clock signals and the first compensation code signal.

According to example embodiments, a clock data recovery circuit includes a phase locked loop (PLL), a code signal generator, and a clock and data generator. The phase locked loop generates a plurality of reference clock signals of which frequencies are modulated based on a first start signal. Each of the plurality of reference clock signals has a first profile that is periodically fluctuated. The code signal generator generates a first compensation code signal based on a second start signal. The first compensation code signal has a second profile that is periodically fluctuated and is different from the first profile. The clock and data generator generates a recovered data signal by sampling an input data signal based on a clock signal. The code signal generator includes a table and a table accumulator. The table stores raw data used to generate the first compensation code signal. The table accumulator generates the first compensation code signal based on the second start signal and the raw data. The clock and data generator includes a phase detector, a filtering circuit, an adder and a phase interpolator. The phase detector generates an up signal and a down signal representing a phase difference between the input data signal and the clock signal. The filtering circuit generates a control code signal based on the up signal and the down signal. The adder sums the control code signal and the first compensation code signal. The phase interpolator generates the clock signal based on the plurality of reference clock signals and an output of the adder. The phase interpolator is configured to compensate a first frequency modulation on the plurality of reference clock signals based on the output of the adder, wherein the first profile corresponds to a second frequency modulation with a first triangular waveform, and has a first waveform that is regularly repeated for each unit interval, the second profile corresponds to a third frequency modulation with a second triangular waveform, and has a second waveform this is regularly repeated for each unit interval.

The first profile and the second profile have opposite shapes. The first waveform increases with a first slope in a first interval of the unit interval and decreases with a second slope in a second interval of the unit interval. The second waveform decreases with the second slope in the first interval and increases with the first slope in the second interval.

The clock data recovery circuit and the communication device according to example embodiments may include the code signal generator that generates the first compensation code signal. When the clock data recovery circuit operates based on the spread spectrum clocking, the frequency modulation on the plurality of reference clock signals that are generated by the phase locked loop may be compensated based on the first compensation code signal. For example, among a frequency modulation component included in the input data signal that is provided from the outside and a frequency modulation component included in the plurality of reference clock signals that are generated internally or by itself (e.g., self-generated), the clock data recovery circuit may have a function of canceling or removing the frequency modulation component generated internally or by itself. Accordingly, the clock data recovery circuit may operate in consideration of only the frequency modulation component provided from the outside, and may have relatively improved or enhanced performance.

BRIEF DESCRIPTION OF THE DRAWINGS

Illustrative, non-limiting example embodiments will be more clearly understood from the following detailed description taken in conjunction with the accompanying drawings.

FIGS. 6A, 6B and 6C are diagrams illustrating examples of a table included in a code signal generator included in a clock data recovery circuit of FIG. 3.

DETAILED DESCRIPTION OF THE EMBODIMENTS

Figure 1:
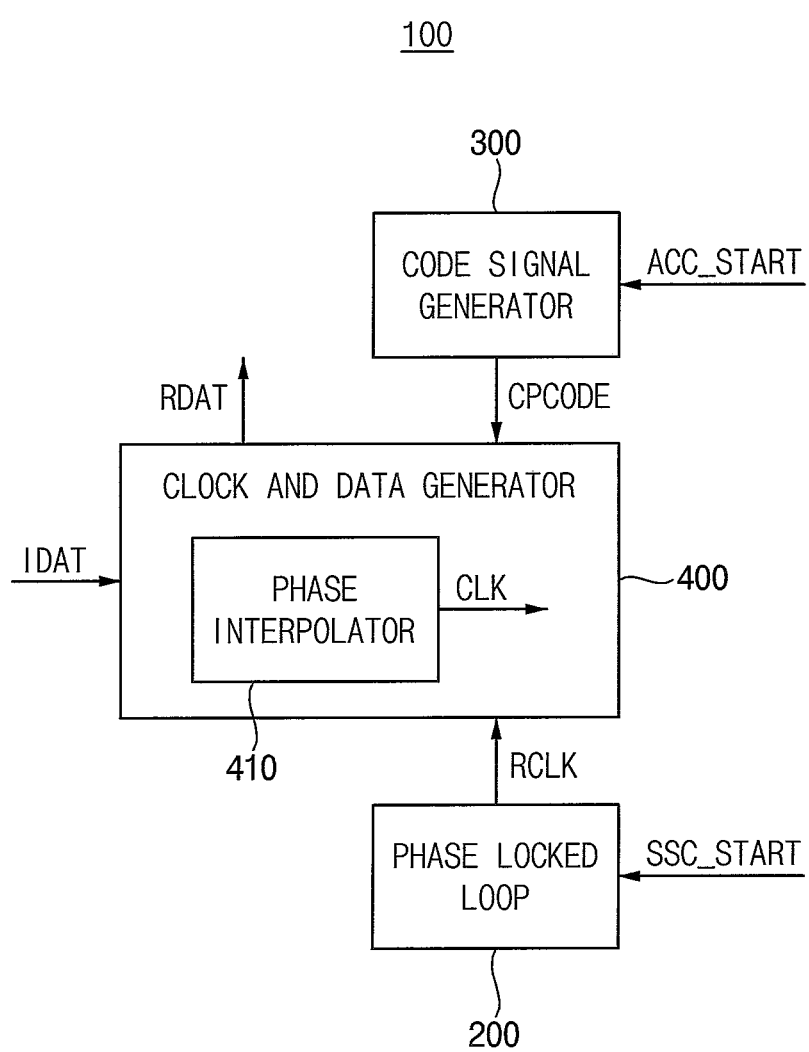
FIG. 1 is a block diagram illustrating a clock data recovery circuit according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a block diagram illustrating a clock data recovery circuit according to example embodiments.

Referring to FIG. 1, a clock data recovery circuit 100 is implemented based on phase interpolation, and includes a phase locked loop (PLL) 200, a code signal generator 300, and a clock and data generator 400.

The phase locked loop 200 generates a plurality of reference clock signals RCLK. For example, each of the plurality of reference clock signals RCLK may swing or toggle between a high level and a logic level, and may have a reference clock frequency.

The phase locked loop 200 performs a frequency modulation on the plurality of reference clock signals RCLK based on a first start signal SSC_START. In other words, the reference clock frequency of each of the plurality of reference clock signals RCLK may be changed or vary based on the first start signal SSC_START. In some embodiments, a controller (not shown in FIG. 1) may be configured to generate SCC_START.

For example, when the first start signal SSC_START is activated, the phase locked loop 200 may generate the plurality of reference clock signals RCLK of which frequencies are modulated (e.g., a plurality of frequency-modulated reference clock signals), and each of the plurality of reference clock signals RCLK may have a first profile that is periodically fluctuated or changed. In this example, each of the plurality of reference clock signals RCLK may have a variable reference clock frequency, and the reference clock frequency may be periodically fluctuated or changed based on the first profile.

For another example, as will be described with reference to FIG. 10, the first start signal SSC_START may be deactivated in a specific operation mode. In this example, the phase locked loop 200 may not perform the frequency modulation on the plurality of reference clock signals RCLK, and may generate the plurality of reference clock signals RCLK each of which has a fixed reference clock frequency.

The code signal generator 300 generates a first compensation code signal CPCODE based on a second start signal ACC_START. In some embodiments, a controller may be configured to generate ACC_START. For example, the first compensation code signal CPCODE may be a digital code, and the code signal generator 300 may be referred to as a digital code signal generator. An example configuration of the code signal generator 300 will be described later.

For example, when the second start signal ACC_START is activated, the code signal generator 300 may generate the first compensation code signal CPCODE having a second profile that is periodically fluctuated and is different from the first profile. The first compensation code signal CPCODE may be used to compensate for the frequency modulation on the plurality of reference clock signals RCLK.

In some example embodiments, the frequencies of the plurality of reference clock signals RCLK may be modulated based on spread spectrum clocking (SSC), and thus the first profile may be provided and/or implemented based on the spread spectrum clocking. In addition, the first compensation code signal CPCODE and the second profile that are used to compensate for the frequency modulation on the plurality of reference clock signals RCLK may be provided and/or implemented based on the spread spectrum clocking.

In some example embodiments, both the first and second profiles may be generated inside the clock data recovery circuit 100, the clock data recovery circuit 100 may recognize or may be aware of all information associated with the first profile, e.g., an amplitude, a frequency, and/or a start timing of the first profile, and thus the second profile may be implemented to have a shape that is exactly opposite to that of the first profile to compensate for the frequency modulation on the plurality of reference clock signals RCLK. Example configurations of the first and second profiles and a profile of the clock signal CLK generated based thereon will be described with reference to FIGS. 2A, 2B and 2C.

Spread spectrum clocking may be employed to reduce electromagnetic interference (EMI), and may, for example, modulate a clock frequency with a triangular waveform, e.g., apply a triangle wave frequency modulation to a clock signal. In other words, the spread spectrum clocking may be employed to broaden the spectral peaks of the clock signal, which may reduce electromagnetic interference. For example, the spread spectrum clocking may be implemented by using a clock signal that, instead of operating at a constant frequency, produces a frequency modulated signal, with the frequency having the shape of a triangle wave as a function of time. The frequency modulation may have an amplitude of about 0.5% to 1.5% (e.g., the frequency may change, over time, by the corresponding fraction, as a result of the frequency modulation) and the triangle wave may have a frequency in the range of about 30 kHz to 33 kHz.

The clock and data generator 400 generates a recovered (or restored) data signal RDAT by sampling the input data signal IDAT based on the clock signal CLK, compensates for the frequency modulation on the plurality of reference clock signals RCLK based on the first compensation code signal CPCODE, and includes a phase interpolator (PI) 410 that generates the clock signal CLK based on the plurality of reference clock signals RCLK and the first compensation code signal CPCODE. In other words, the clock and data generator 400 may be implemented based on the phase interpolation. An example configuration of the clock and data generator 400 will be described with reference to FIG. 3.

The phase interpolation may be used to generate a clock signal having phase ranges between the phases of two input clocks, which have phases different from each other. For example, a clock signal having a phase in the range of about 0 to 90 degrees may be generated using a clock signal having about 0 degree phase and another clock signal having about 90 degree phase. When the phase interpolation is used as described above, a clock signal synchronized with a data signal may be generated and provided within a relatively short time even if the jitter occurs on the data signal transmitted with a relatively high speed.

In some example embodiments, the input data signal IDAT may be provided such that a frequency of the input data signal IDAT is modulated and the input data signal IDAT has a third profile that is periodically fluctuated and is different from the first profile and the second profile. For example, as with the plurality of reference clock signals RCLK, the frequency of the input data signal IDAT may be modulated based on the spread spectrum clocking, and thus the third profile may be provided and/or implemented based on the spread spectrum clocking.

In some example embodiments, the input data signal IDAT may be received from an external device, the clock data recovery circuit 100 may not recognize any information associated with the third profile, and thus there may be no correlation between the first profile and the third profile. Example configurations of the third profile and various examples in which the frequency modulation is experienced at the receiving end (or experienced by the receiver) depending on the configurations of the third profile will be described with reference to FIGS. 8A, 8B, 8C, 8D, 8E, 8F and 8G.

Typically, a clock data recovery circuit may be used as a receiver in a communication device, and the communication device may further include a transmitter and may exchange data with other communication devices using the transmitter and the receiver. In addition, a phase locked loop may be included in the communication device to drive or operate the transmitter and the receiver, and one phase locked loop may be shared by the transmitter and receiver because a relatively large area and high cost are required to implement the phase locked loop. When the spread spectrum clocking is applied or employed to data signals transmitted between the communication devices, the phase locked loop may generate a clock signal of which a frequency is modulated based on the spread spectrum clocking. Since the clock signal generated by the phase locked loop is shared by the transmitter and the receiver, the receiver may also operate based on the clock signal of which the frequency is modulated based on the spread spectrum clocking.

The clock data recovery circuit 100 based on the phase interpolation according to example embodiments may include the code signal generator 300 that generates the first compensation code signal CPCODE. When the clock data recovery circuit 100 operates based on the spread spectrum clocking, the frequency modulation on the plurality of reference clock signals RCLK that are generated by the phase locked loop 200 may be compensated based on the first compensation code signal CPCODE. For example, among a frequency modulation component included in the input data signal IDAT that is provided from the outside and a frequency modulation component included in the plurality of reference clock signals RCLK that are generated internally or by itself (e.g., self-generated), the clock data recovery circuit 100 may have a function of canceling or removing the frequency modulation component generated internally or by itself. Accordingly, the clock data recovery circuit 100 may operate in consideration of only the frequency modulation component provided from the outside, and may have relatively improved or enhanced performance.

Figure 2A:
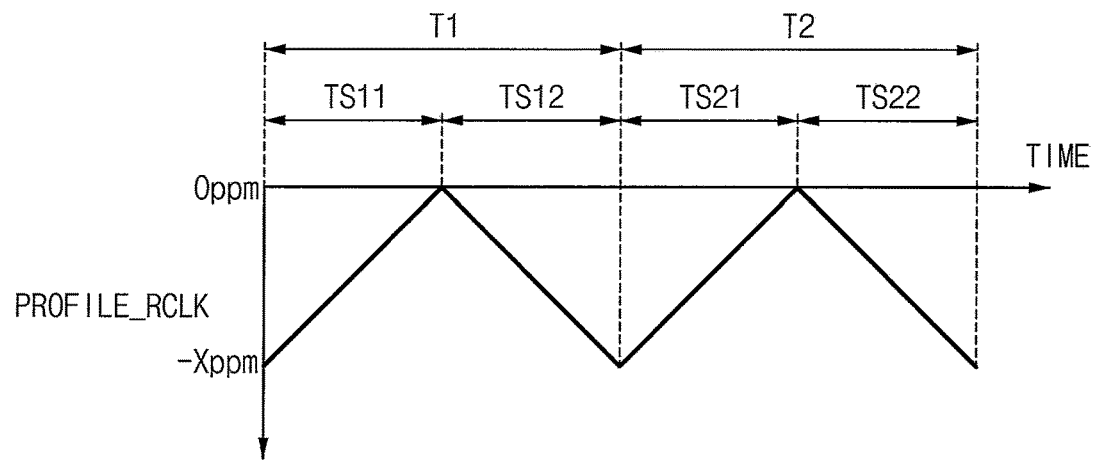
FIGS. 2A, 2B and 2C are diagrams for describing an operation of a clock data recovery circuit of FIG. 1.
Figure 2B:
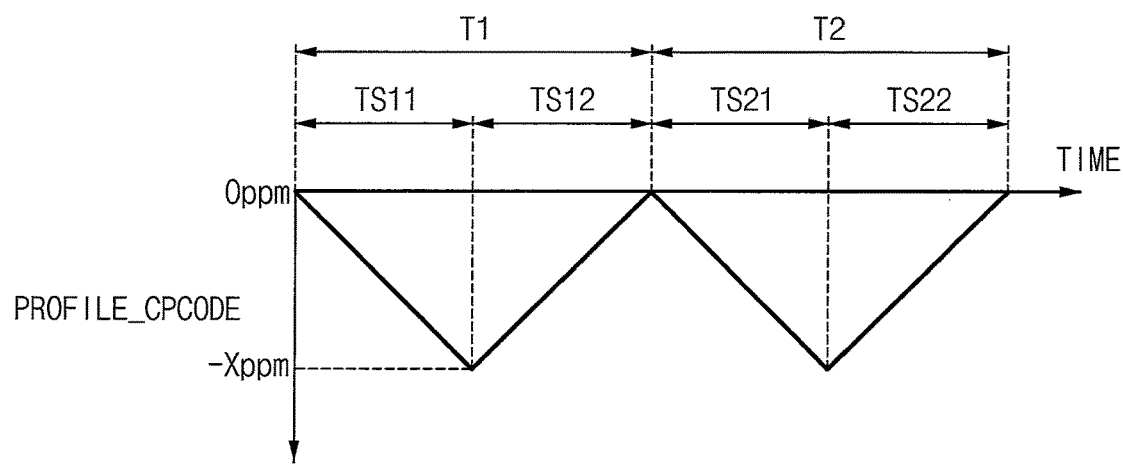
Figure 2C:
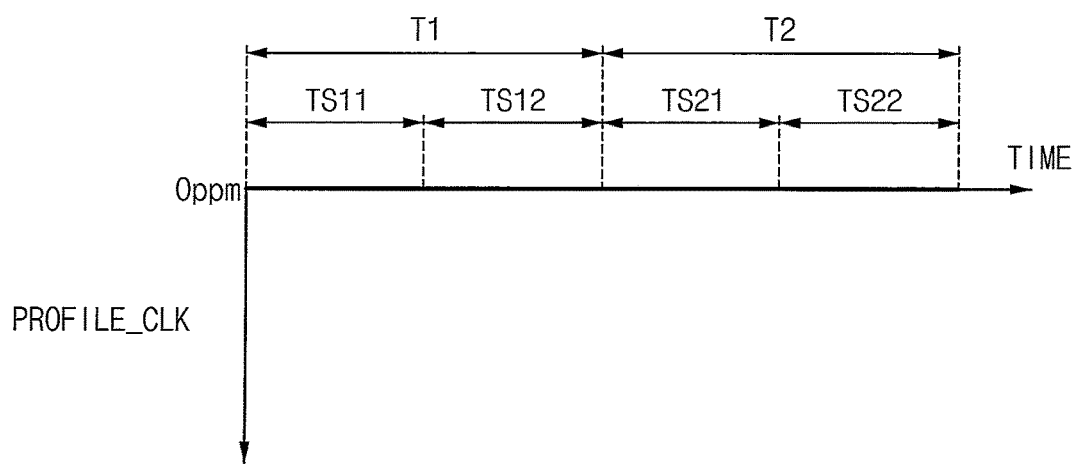

FIGS. 2A, 2B and 2C are diagrams for describing an operation of a clock data recovery circuit of FIG. 1.

FIG. 2A illustrates a first profile PROFILE_RCLK for the plurality of reference clock signals RCLK that are generated from the phase locked loop 200. FIG. 2B illustrates a second profile PROFILE_CPCODE for the first compensation code signal CPCODE that is generated from the code signal generator 300. FIG. 2C illustrates a profile PROFILE_CLK for the clock signal CLK that is generated from the phase interpolator 410 based on the plurality of reference clock signals RCLK and the first compensation code signal CPCODE. In FIGS. 2A, 2B and 2C, a horizontal axis represents the change in time, and a vertical axis represents the change in a frequency of each signal.

Referring to FIGS. 2A and 2B, when the spread spectrum clocking is applied to the plurality of reference clock signals RCLK, each of the first profile PROFILE_RCLK and the second profile PROFILE_CPCODE may correspond to a frequency modulation with a triangular waveform, and the first profile PROFILE_RCLK and the second profile PROFILE_CPCODE may have opposite shapes. In other words, the second profile PROFILE_CPCODE may be generated to have a shape exactly opposite to that of the first profile PROFILE_RCLK by replicating, imitating or simulating the first profile PROFILE_RCLK.

In some example embodiments, each of the first profile PROFILE_RCLK and the second profile PROFILE_CPCODE may have a waveform that is regularly repeated for each unit interval, the first profile PROFILE_RCLK may have a waveform that increases with a first slope in a first interval of the unit interval and decreases with a second slope in a second interval of the unit interval, and the second profile PROFILE_CPCODE may have a waveform that decreases with the second slope in the first interval and increases with the first slope in the second interval.

For example, the waveform of the first profile PROFILE_RCLK may increase with the first slope from about −X ppm to about 0 ppm in a first interval TS11 of a first unit interval T1, and may decrease with the second slope from about 0 ppm to about −X ppm in a second interval TS12 of the first unit interval T1, where X is a positive real number. The waveform of the first profile PROFILE_RCLK in a first interval TS21 and a second interval TS22 of a second unit interval T2 subsequent to the first unit interval T1 may be substantially the same as the waveform of the first profile PROFILE_RCLK in the first interval TS11 and the second interval TS22 of the first unit interval T1. A length of the first unit interval T1 may be substantially equal to a length of the second unit period T2. In other words, the waveform of the first profile PROFILE_RCLK may be implemented such that a frequency changes in a triangular shape within one unit interval (e.g., the first unit interval T1).

The waveform of the second profile PROFILE_CPCODE may decrease with the second slope from about 0 ppm to about −X ppm in the first interval TS11 of the first unit interval T1, and may increase with the first slope from about −X ppm to about 0 ppm in the second interval TS12 of the first unit interval T1. The waveform of the second profile PROFILE_CPCODE in the first interval TS21 and the second interval TS22 of the second unit interval T2 may be substantially the same as the waveform of the second profile PROFILE_CPCODE in the first interval TS11 and the second interval TS22 of the first unit interval T1. In other words, the waveform of the second profile PROFILE_CPCODE may be implemented such that a frequency changes in a shape of an inverted triangle shape within one unit interval (e.g., the first unit interval T1).

In some example embodiments, lengths of sub-intervals (e.g., the first interval TS21 and the second interval TS22) within one unit interval (e.g., the first unit interval T1) may be substantially equal to each other. In this case, the first slope and the second slope may have the same magnitude. For example, when the first slope is A, the second slope may be −A, where A is a positive real number.

In some example embodiments, X may be 5000. In other words, about 0 ppm may represent a case with substantially the same frequency as an original (or reference) frequency, and about −5000 ppm may represent a case with a frequency of about 0.5% decrease from the original frequency. In addition, the unit interval (e.g., the first unit interval T1) may represent a time interval corresponding to about 33 kHz. However, example embodiments are not limited thereto.

Although FIGS. 2A and 2B illustrate an example where each profile has the frequency that only decreases with respect to the original frequency, example embodiments are not limited thereto, and each profile may have a frequency that increases and decreases with respect to the original frequency.

Referring to FIG. 2C, the phase interpolator 410 may generate the clock signal CLK based on the plurality of reference clock signals RCLK and the first compensation code signal CPCODE having the first and second profiles PROFILE_RCLK and PROFILE_CPCODE, respectively, that are exactly opposite to each other, and thus a waveform of the profile PROFILE_CLK for the clock signal CLK may always have a constant (or fixed) frequency without increasing or decreasing the frequency. In other words, when the clock signal CLK is generated based on the first compensation code signal CPCODE according to example embodiments, the clock signal CLK may be generated by canceling the frequency modulation component included in the plurality of reference clock signals RCLK and generated internally or by itself.

Figure 3:
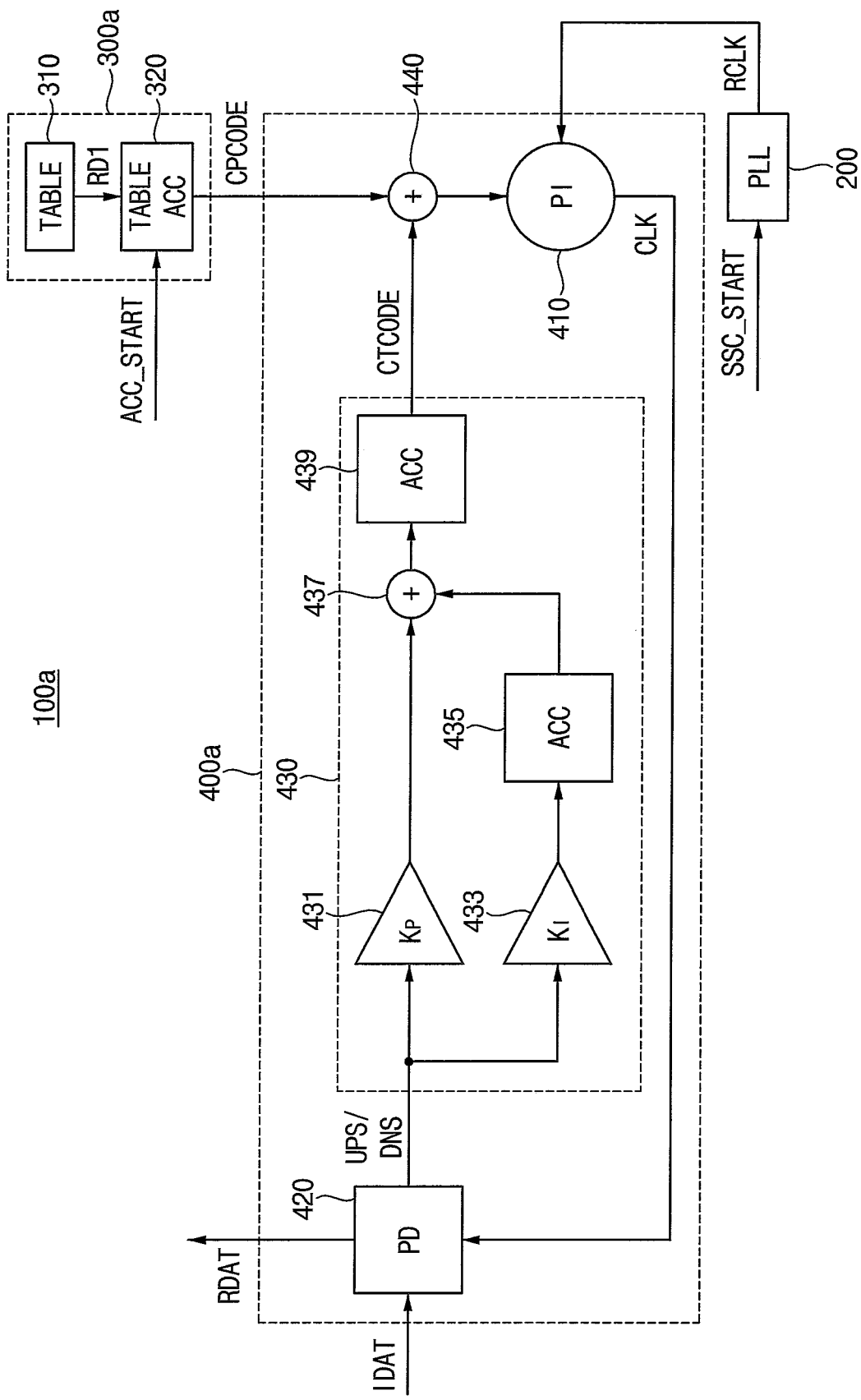
FIG. 3 is a block diagram illustrating an example of a clock data recovery circuit of FIG. 1.

FIG. 3 is a block diagram illustrating an example of a clock data recovery circuit of FIG. 1. The descriptions repeated with FIG. 1 will be omitted.

Referring to FIG. 3, a clock data recovery circuit 100a includes a phase locked loop 200, a code signal generator 300a, and a clock and data generator 400a.

The phase locked loop 200 may be substantially the same as the phase locked loop 200 in FIG. 1. The phase locked loop 200 may generate the plurality of reference clock signals RCLK of which the frequencies are modulated based on the first start signal SSC_START, and each of the plurality of reference clock signals RCLK may have the first profile (e.g., the first profile PROFILE_RCLK in FIG. 2A) that is periodically fluctuated.

The code signal generator 300a may generate the first compensation code signal CPCODE based on the second start signal ACC_START, and the first compensation code signal CPCODE may have the second profile (e.g., the second profile PROFILE_CPCODE in FIG. 2B) that is periodically fluctuated.

The code signal generator 300a may include a table 310 and a table accumulator (ACC) 320.

The table 310 may store raw data RD1 used to generate the first compensation code signal CPCODE. For example, the raw data RD1 may include derivative values (or differential values) of the second profile, and the table 310 may be referred to as a derivative SSC storage table. An example configuration of the table 310 will be described with reference to FIGS. 6A, 6B and 6C.

In some example embodiments, the table 310 may be stored in at least one of various nonvolatile memory devices, such as an erasable programmable read-only memory (EPROM), an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), or the like, and/or at least one of various volatile memory devices, such as a dynamic random access memory (DRAM), a static random access memory (SRAM), or the like.

The table accumulator 320 may generate the first compensation code signal CPCODE based on the second start signal ACC_START and the raw data RD1. For example, the table accumulator 320 may include at least one accumulator that accumulates (or integrates) the raw data RD1. An example configuration of the table accumulator 320 will be described with reference to FIG. 5.

The clock and data generator 400a may generate the clock signal CLK, and may generate the recovered data signal RDAT by sampling the input data signal IDAT based on the clock signal CLK.

The clock and data generator 400a may include a phase interpolator 410, a phase detector (PD) 420, a filtering circuit 430 and a first adder 440.

The phase detector 420 may generate the recovered data signal RDAT by sampling the input data signal IDAT based on the clock signal CLK. For example, the phase detector 420 may generate the recovered data signal RDAT by sampling the input data signal IDAT at a rising edge of the clock signal CLK. For another example, the phase detector 420 may generate the recovered data signal RDAT by sampling the input data signal IDAT at a falling edge of the clock signal CLK.

In addition, the phase detector 420 may generate an up signal UPS and a down signal DNS based on the input data signal IDAT and the clock signal CLK. The up signal UPS and the down signal DNS generated by the phase detector 420 may have a pulse width difference that is linearly proportional to a phase difference between the input data signal IDAT and the clock signal CLK. Thus, as the phase difference between the input data signal IDAT and the clock signal CLK increases, the pulse width difference between the up signal UPS and the down signal DNS may continuously increase.

In some example embodiments, the up signal UPS and the down signal DNS generated by the phase detector 420 may be aligned such that the up and down signals UPS and DNS have falling edges at the falling edge of the clock signal CLK, and thus rising edges of the up and down signals UPS and DNS may have a phase difference corresponding to the phase difference between the input data signal IDAT and the clock signal CLK. In other example embodiments, the up signal UPS and the down signal DNS generated by the phase detector 420 may be aligned such that the up and down signals UPS and DNS have rising edges at the rising edge of the clock signal CLK, and thus falling edges of the up and down signals UPS and DNS may have a phase difference corresponding to the phase difference between the input data signal IDAT and the clock signal CLK. In still other example embodiments, pulses of the up signal UPS and the down signal DNS may be center-aligned, but not limited thereto.

In some example embodiments, the phase detector 420 may be implemented as a bang-bang phase detector, but example embodiments are not limited thereto.

The filtering circuit 430 may generate a control code signal CTCODE based on (e.g., by filtering) the up signal UPS and the down signal DNS. For example, the control code signal CTCODE may be a digital code, and the filtering circuit 430 may be referred to as a digital filtering circuit that performs digital filtering.

The filtering circuit 430 may include a first filter ($K_P$) 431, a second filter (KO 433, a first accumulator 435, a second adder 437 and a second accumulator 439.

Each of the first filter 431 and the second filter 433 may filter the up signal UPS and the down signal DNS. The first accumulator 435 may accumulate an output of the second filter 433. For example, the first filter 431 may be a proportional filter, and the second filter 433 may be an integral filter. For example, the first filter 431 may form or serve a proportional path, and the second filter 433 and the first accumulator 435 may form or serve an integral path.

The second adder 437 may sum or add an output of the first filter 431 and an output of the first accumulator 435. The second accumulator 439 may generate the control code signal CTCODE by accumulating an output of the second adder 437.

The first adder 440 may sum the control code signal CTCODE and the first compensation code signal CPCODE.

The phase interpolator 410 may generate the clock signal CLK based on the plurality of reference clock signals RCLK and the first compensation code signal CPCODE, and may compensate for the frequency modulation on the plurality of reference clock signals RCLK based on the first compensation code signal CPCODE. As illustrated in FIG. 3, the phase interpolator 410 may receive an output of the first adder 440 in which the control code signal CTCODE and the first compensation code signal CPCODE are summed, and thus may compensate for the frequency modulation on the plurality of reference clock signals RCLK based on the output of the first adder 440.

In some example embodiments, the plurality of reference clock signals RCLK may include four reference clock signals that have phases of about 0 degrees, about 90 degrees, about 180 degrees and about 270 degrees, respectively. The phase interpolator 410 may select two reference clock signals having phases adjacent to each other from among the four reference clock signals depending on a quadrant in which the clock signal CLK is currently located, and may generate the clock signal CLK having a phase between the selected reference clock signals.

Figure 4:
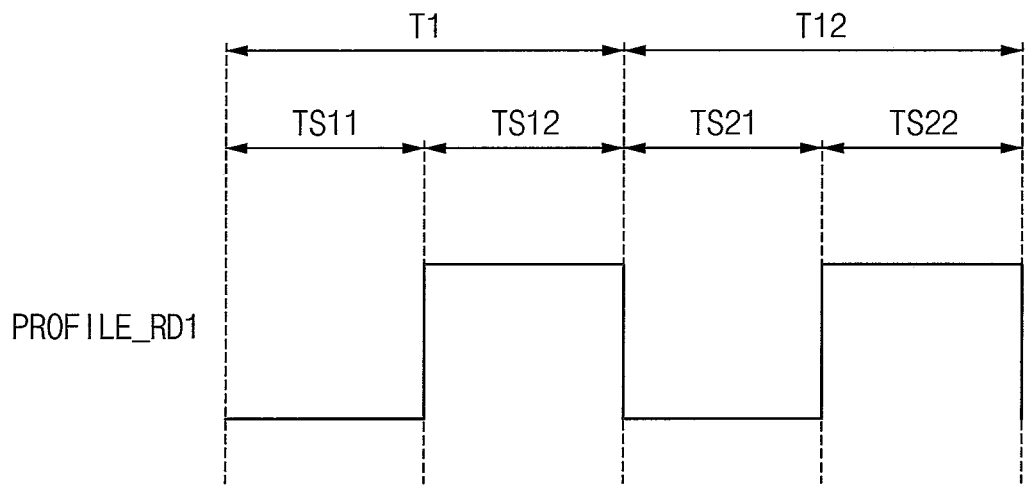
FIG. 4 is a diagram for describing an operation of a clock data recovery circuit of FIG. 3.

FIG. 4 is a diagram for describing an operation of a clock data recovery circuit of FIG. 3.

Referring to FIG. 4, a profile PROFILE_RD1 for the raw data RD1 that is provided from the table 310 included in the code signal generator 300a is illustrated.

In some example embodiments, to generate the first compensation code signal CPCODE having the second profile PROFILE_CPCODE illustrated in FIG. 2B, the raw data RD1 may have the profile PROFILE_RD1 illustrated in FIG. 4.

For example, a waveform of the profile PROFILE_RD1 for the raw data RD1 may have a first constant value corresponding to the second slope in the first interval TS11 of the first unit interval T1, and may have a second constant value corresponding to the first slope in the second interval TS12 of the first unit interval T1. The waveform of the profile PROFILE_RD1 for the raw data RD1 in the first interval TS21 and the second interval TS22 of the second unit interval T2 may be substantially the same as the waveform of the profile PROFILE_RD1 for the raw data RD1 in the first interval TS11 and the second interval TS22 of the first unit interval T1. In other words, the waveform of the profile PROFILE_RD1 for the raw data RD1 may be implemented in the form of a square wave.

Figure 5:
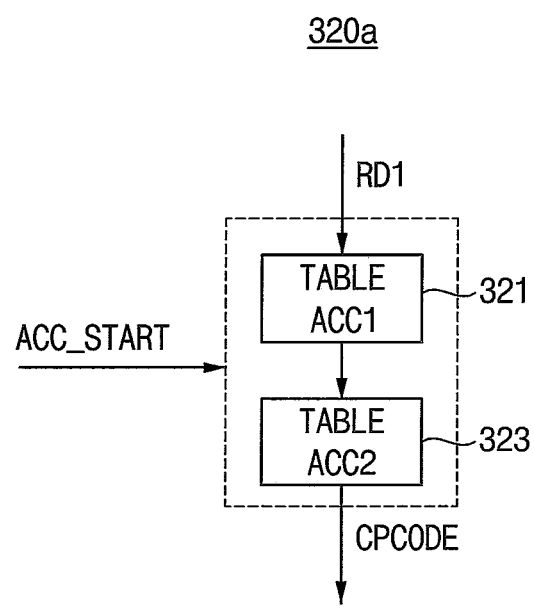
FIG. 5 is a block diagram illustrating an example of a table accumulator included in a code signal generator included in a clock data recovery circuit of FIG. 3.

FIG. 5 is a block diagram illustrating an example of a table accumulator included in a code signal generator included in a clock data recovery circuit of FIG. 3.

Referring to FIG. 5, a table accumulator 320a may include a first table accumulator 321 and a second table accumulator 323.

The first table accumulator 321 may accumulate the raw data RD1 provided from the table 310 based on the second start signal ACC_START. The second table accumulator 323 may generate the first compensation code signal CPCODE by accumulating an output of the first table accumulator 321 based on the second start signal ACC_START.

When two table accumulators 321 and 323 are connected in series as illustrated in FIG. 5, the table 310 may be simplified to include only two constant values, and thus the number of bits of data included in the table 310 and a size of the table 310 may be reduced.

FIGS. 6A, 6B and 6C are diagrams illustrating examples of a table included in a code signal generator included in a clock data recovery circuit of FIG. 3.

Referring to FIGS. 6A, 6B and 6C, the table 310 may include interval information corresponding to a length of each interval and slope information in each interval.

In some example embodiments, the table 310 may include values S1 and S2 corresponding to the slopes in all of the intervals TS11, TS12, TS21 and TS22 included in the unit intervals T1 and T2, as illustrated in FIG. 6A. For example, the value S1 may correspond to the second slope in the first intervals TS11 and TS21, and the value S2 may correspond to the first slope in the second intervals TS12 and TS22. For example, each of the first intervals TS11 and TS21 may represent a decreasing interval, and each of the second intervals TS12 and TS22 may represent an increasing interval.

In other example embodiments, the waveform of the second profile PROFILE_CPCODE may be implemented in the form in which a waveform of one unit interval (e.g., the first unit interval T1) is repeated, and thus the table 310 may include only values S1 and S2 corresponding to slopes in first and second intervals TS1 and TS2 included in one unit interval, as illustrated in FIG. 6B. For example, the value S1 may correspond to the second slope in the first interval TS1, and the value S2 may correspond to the first slope in the second interval TS2. For example, the first interval TS1 may correspond to the first intervals TS11 and TS21 in FIG. 6A, and the second interval TS2 may correspond to the second intervals TS12 and TS22 in FIG. 6A.

In still other example embodiments, the first slope and the second slope may have the same magnitude, and thus the table 310 may include only a value S1 corresponding to a slope in one interval TS included in one unit interval, as illustrated in FIG. 6C. For example, the interval TS may correspond to the first intervals TS11 and TS21 in FIG. 6A and the first interval TS1 in FIG. 6B, and the value S1 may correspond to the second slope. For example, the first slope in the second intervals TS12 and TS22 in FIG. 6A and the second interval TS2 in FIG. 6B may be obtained by S2=−S1.

However, example embodiments are not limited thereto, and a configuration of the table 310 may be variously changed according to example embodiments.

FIGS. 7A, 7B, 8A, 8B, 8C, 8D, 8E, 8F and 8G are diagrams for describing an operation of a clock data recovery circuit of FIG. 3.

Figure 7A:
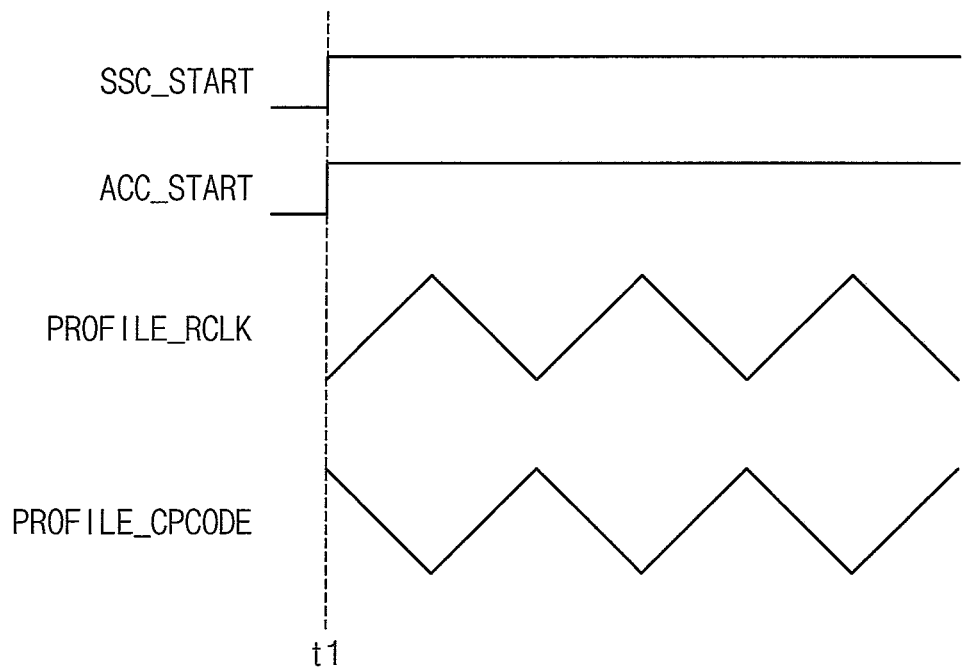
FIGS. 7A, 7B, 8A, 8B, 8C, 8D, 8E, 8F and 8G are diagrams for describing an operation of a clock data recovery circuit of FIG. 3.
Figure 7B:
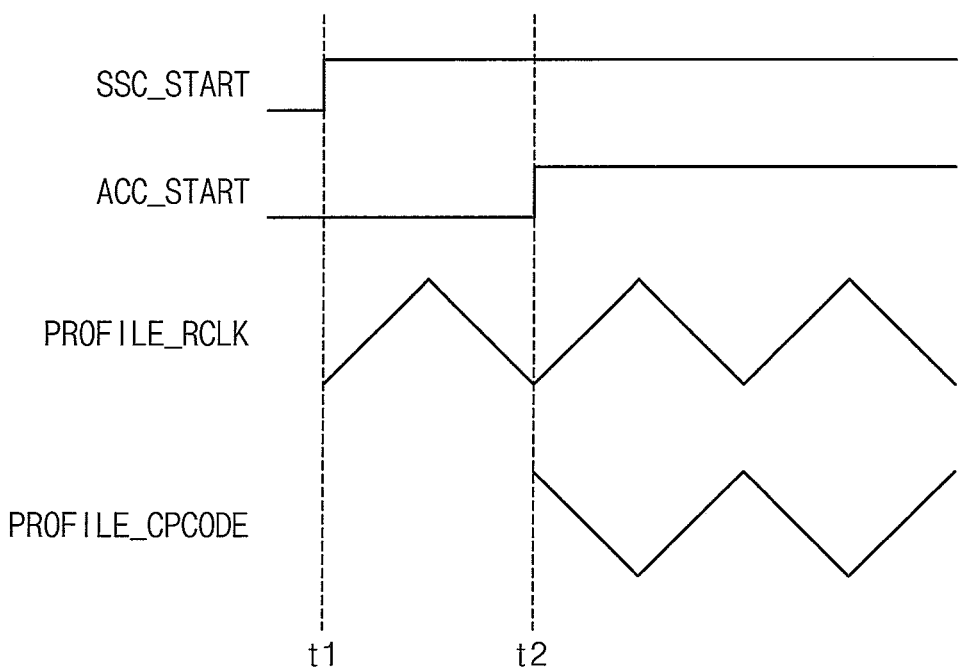

Referring to FIGS. 7A and 7B, the first start signal SSC_START that is applied to the phase locked loop 200 and the second start signal ACC_START that is applied to the code signal generator 300a (e.g., that is applied to the table accumulator 320) are illustrated.

In some example embodiments, the first start signal SSC_START and the second start signal ACC_START may be substantially simultaneously or concurrently activated at a first time point t1, as illustrated in FIG. 7A. For example, in some embodiments, the start signals may be asserted simultaneously by a controller. The phase locked loop 200 and the table accumulator 320 may substantially simultaneously start to generate the plurality of reference clock signals RCLK having the first profile PROFILE_RCLK and the first compensation code signal CPCODE having the second profile PROFILE_CPCODE based on the first start signal SSC_START and the second start signal ACC_START.

In other example embodiments, the first start signal SSC_START may be activated at a first time point t1, and the second start signal ACC_START may be activated at a second time point t2 after the first time point t1, as illustrated in FIG. 7B. The phase locked loop 200 may start to generate the plurality of reference clock signals RCLK having the first profile PROFILE_RCLK at the first time point t1 based on the first start signal SSC_START, and the table accumulator 320 may start to generate the first compensation code signal CPCODE having the second profile PROFILE_CPCODE at the second time point t2 based on the second start signal ACC_START.

In some example embodiments, activation timings of the first and second start signals SSC_START and ACC_START may be variously changed according to example embodiments. As described above, the clock data recovery circuit 100a may recognize all information (e.g., the amplitude, the frequency, the start timing, or the like) associated with the first profile PROFILE_RCLK, and thus the clock data recovery circuit 100a may generate the first compensation code signal CPCODE to always have the second profile PROFILE_CPCODE that is exactly opposite to the first profile PROFILE_RCLK, regardless of the activation timings of the first and second start signals SSC_START and ACC_START.

Although not illustrated in detail, before the first time point t1, which is before the first start signal SSC_START is activated, the plurality of reference clock signals RCLK may not be generated or the frequency modulation may not be performed on the plurality of reference clock signals RCLK. Similarly, before the first time point t1 or the second time point t2, which is before the second start signal ACC_START is activated, the first compensation code signal CPCODE may not be generated.

Figure 8A:
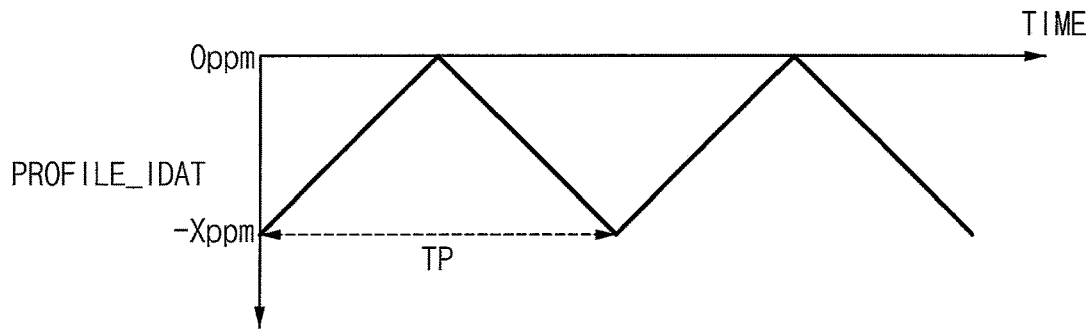

Referring to FIG. 8A, a third profile PROFILE_IDAT for the input data signal IDAT that is received by the clock and data generator 400a is illustrated.

As illustrated in FIG. 8A, when the spread spectrum clocking is applied to the input data signal IDAT, the third profile PROFILE_IDAT may correspond to a frequency modulation with a triangular waveform and may have a waveform that is regularly repeated for each unit interval, as with the first and second profiles PROFILE_RCLK and PROFILE_CPCODE. For example, the same spread spectrum clocking may be applied to the plurality of reference clock signals RCLK and the input data signal IDAT. In this case, X=5000 and TP=T1, as described with reference to FIGS. 2A and 2B.

However, even if the same spread spectrum clocking is applied to the plurality of reference clock signals RCLK and the input data signal IDAT, the third profile PROFILE_IDAT and the first profile PROFILE_RCLK may have no correlation at all depending on the application. As will be described later, the frequency modulation experienced at the receiving end may vary if example embodiments are not employed to the clock data recovery circuit, and the frequency modulation experienced at the receiving end may be constant if example embodiments are employed to the clock data recovery circuit.

Figure 8B:
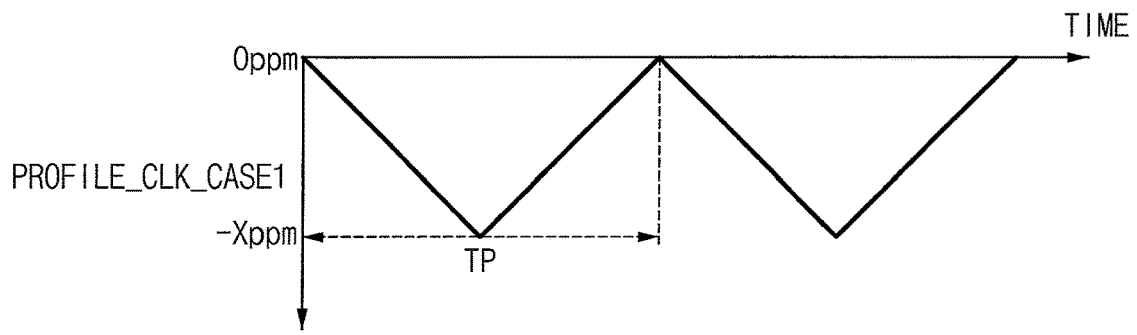
Figure 8C:
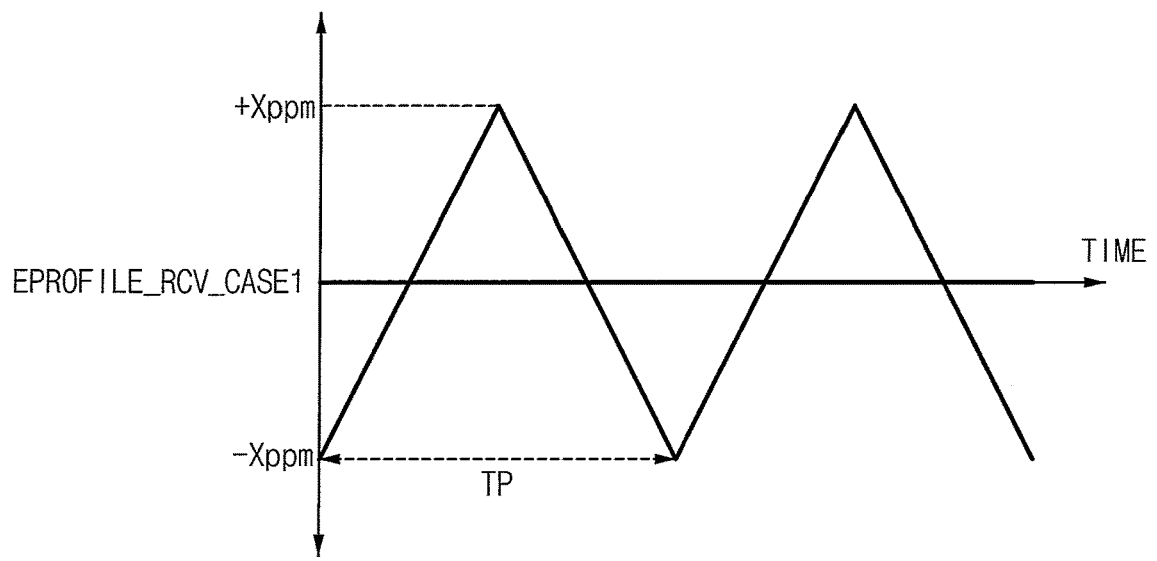

Referring to FIGS. 8B and 8C, an example of a profile PROFILE_CLK_CASE1 for a clock signal that is generated based on a plurality of reference clock signals and an example of an effective profile EPROFILE_RCV_CASE1 for the frequency modulation experienced at the receiving end are illustrated when the clock data recovery circuit does not have the function of canceling the self-generated frequency modulation component.

When the third profile PROFILE_IDAT for the input data signal IDAT in FIG. 8A and the profile PROFILE_CLK_CASE1 for the clock signal in FIG. 8B overlap, the receiving end may experience that the frequency changes from about +X ppm to about −X ppm, as illustrated by the effective profile EPROFILE_RCV_CASE1 in FIG. 8C.

Figure 8D:
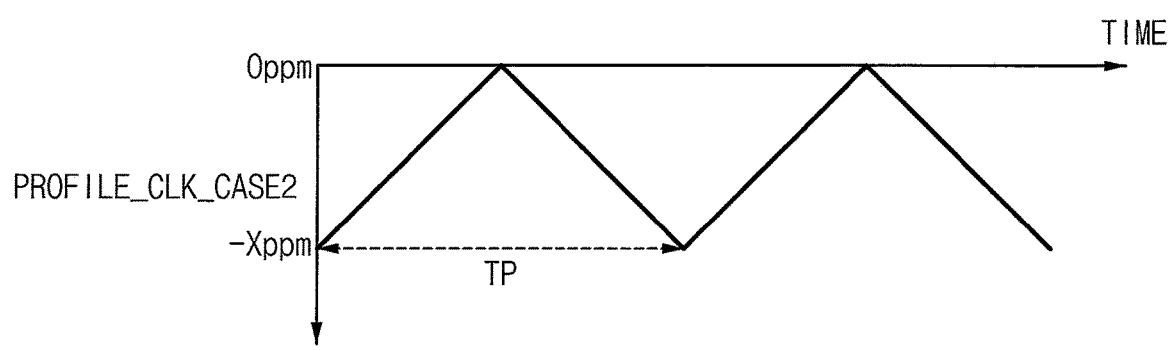
Figure 8E:
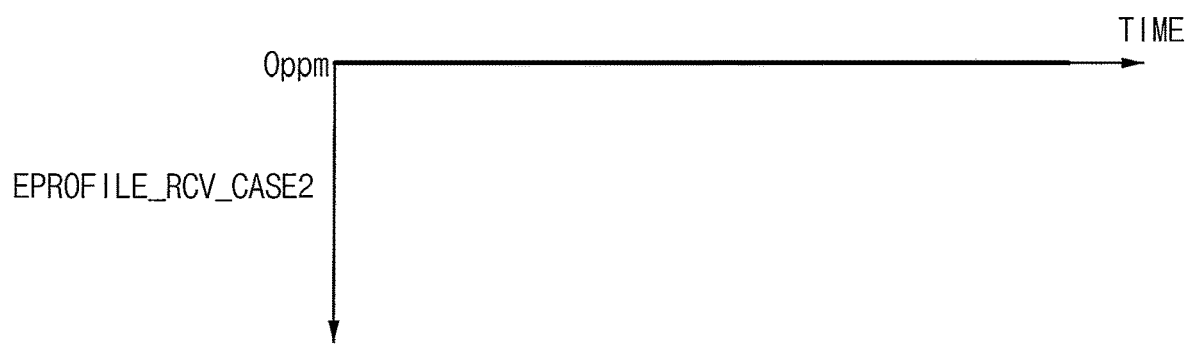

Referring to FIGS. 8D and 8E, another example of a profile PROFILE_CLK_CASE2 for a clock signal that is generated based on a plurality of reference clock signals and another example of an effective profile EPROFILE_RCV_CASE2 for the frequency modulation experienced at the receiving end are illustrated when the clock data recovery circuit does not have the function of canceling the self-generated frequency modulation component.

When the third profile PROFILE_IDAT for the input data signal IDAT in FIG. 8A and the profile PROFILE_CLK_CASE2 for the clock signal in FIG. 8D overlap, the receiving end may experience that the frequency is constant without any change, as illustrated by the effective profile EPROFILE_RCV_CASE2 in FIG. 8E.

As described above, when the clock data recovery circuit does not have the function of canceling the self-generated frequency modulation component, there is a problem that the effective profile of the frequency modulation experienced at the receiving end may be formed as illustrated in FIGS. 8C and 8E or may be formed in various other forms, and it is difficult to predict the effective profile.

Figure 8F:
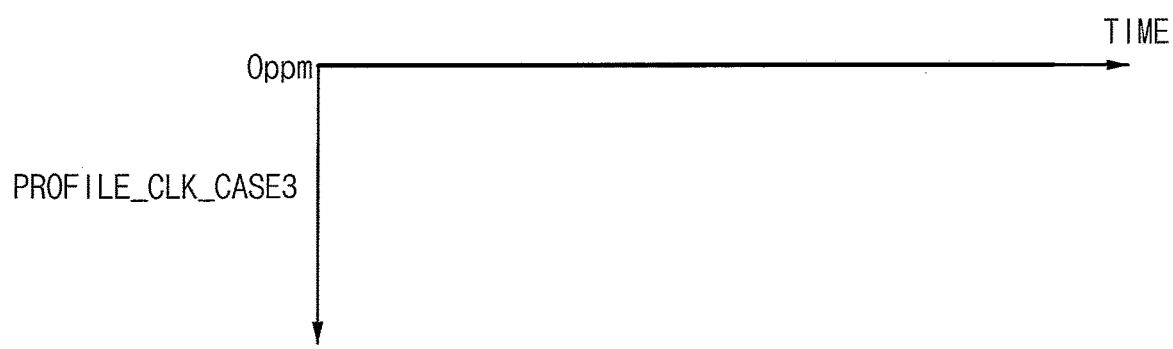
Figure 8G:
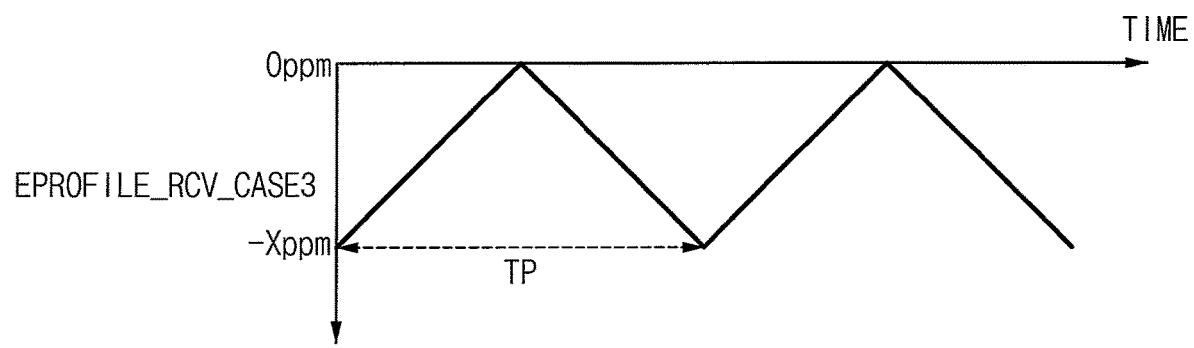

Referring to FIGS. 8F and 8G, a profile PROFILE_CLK_CASE3 for the clock signal CLK that is generated based on the plurality of reference clock signals RCLK and an effective profile EPROFILE_RCV_CASE3 for the frequency modulation experienced at the receiving end are illustrated when the clock data recovery circuit 100a has the function of canceling the self-generated frequency modulation component according to example embodiments. The profile PROFILE_CLK_CASE3 for the clock signal CLK in FIG. 8F may be substantially the same as the profile PROFILE_CLK for the clock signal CLK in FIG. 2C.

When the third profile PROFILE_IDAT for the input data signal IDAT in FIG. 8A and the profile PROFILE_CLK_CASE3 for the clock signal CLK in FIG. 8F overlap, the receiving end (e.g., the clock data recovery circuit 100a according to example embodiments) may experience that the frequency changes as illustrated by the effective profile EPROFILE_RCV_CASE3 in FIG. 8G.

As described above, when the clock data recovery circuit 100a has the function of canceling the self-generated frequency modulation component according to example embodiments, the profile PROFILE_CLK_CASE3 for the clock signal CLK may always have a constant waveform without increasing or decreasing, as illustrated in FIG. 8F, and the effective profile for the frequency modulation experienced at the receiving end may always be formed as illustrated in FIG. 8G. Accordingly, the clock data recovery circuit 100a may operate in consideration of only the frequency modulation component provided from the outside, and may have relatively improved or enhanced performance.

Figure 9:
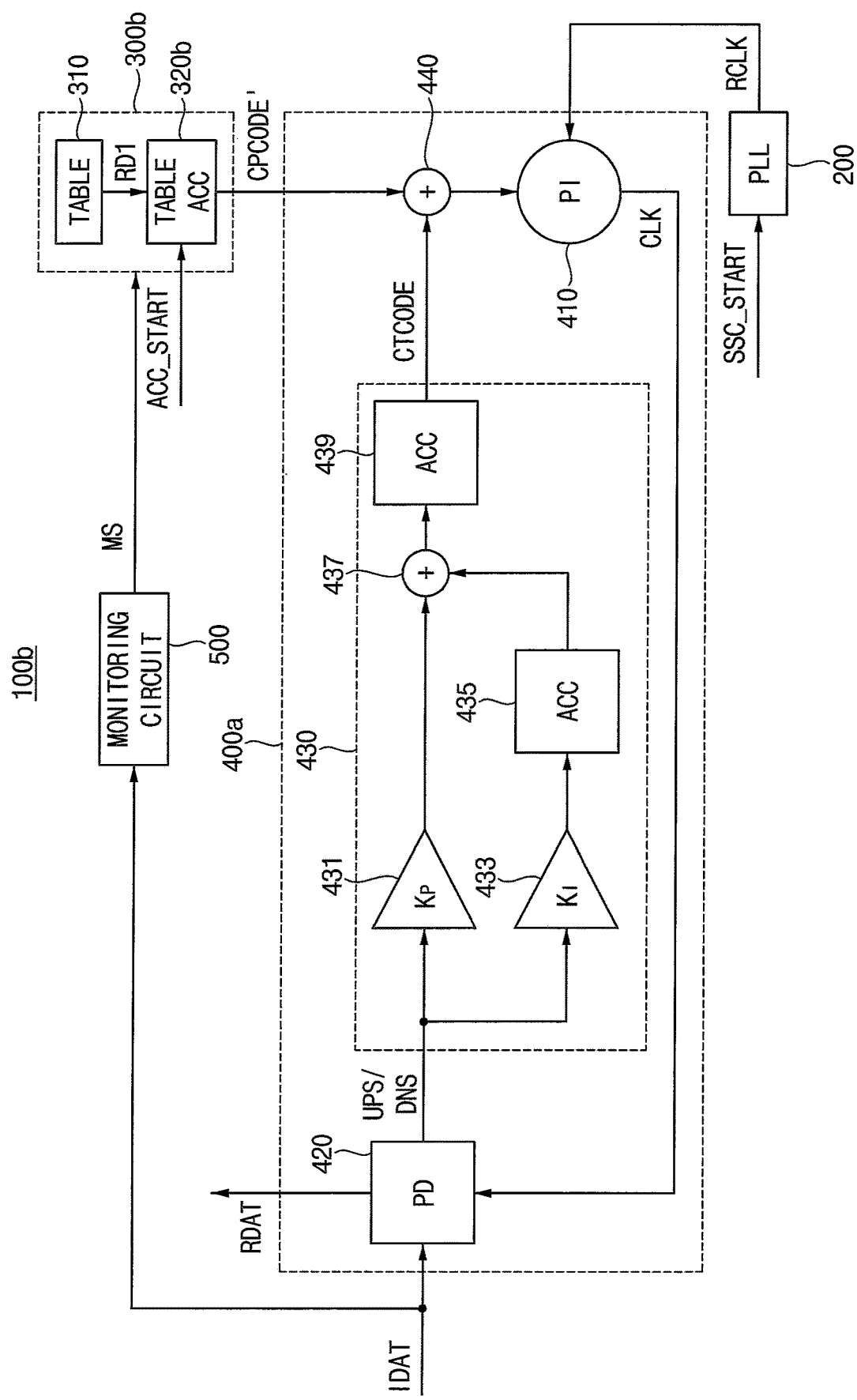
FIGS. 9 and 10 are block diagrams illustrating other examples of a clock data recovery circuit of FIG. 1.
Figure 10:
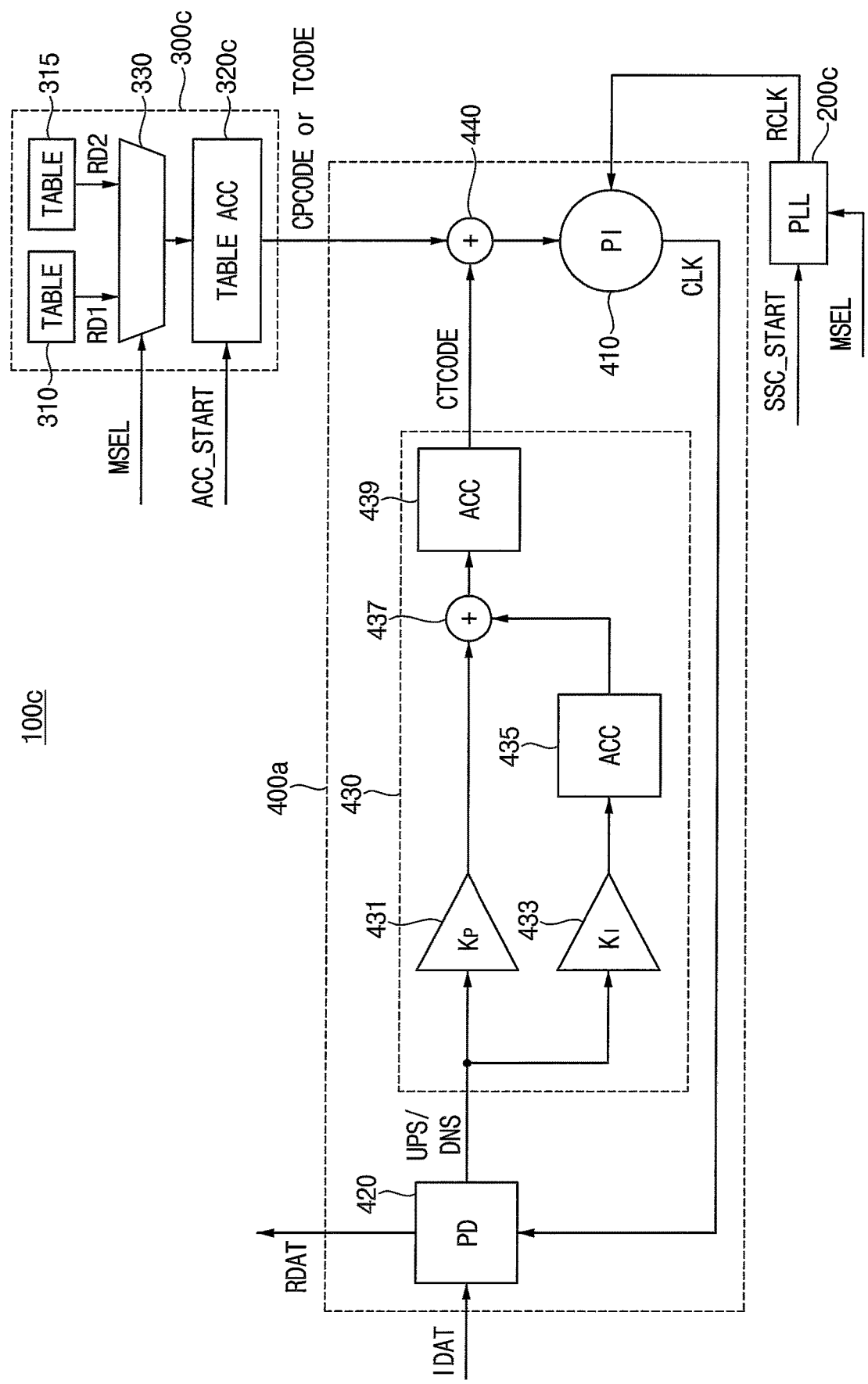

FIGS. 9 and 10 are block diagrams illustrating other examples of a clock data recovery circuit of FIG. 1. The descriptions repeated with FIG. 3 will be omitted.

Referring to FIG. 9, a clock data recovery circuit 100b includes a phase locked loop 200, a code signal generator 300b, and a clock and data generator 400a. The clock data recovery circuit 100b may further include a monitoring circuit 500.

The clock data recovery circuit 100b may be substantially the same as the clock data recovery circuit 100a of FIG. 3, except that the clock data recovery circuit 100b further includes the monitoring circuit 500 and a configuration of the code signal generator 300b is partially changed.

The input data signal IDAT may be provided such that the frequency of the input data signal IDAT is modulated and the input data signal IDAT has the third profile (e.g., the third profile PROFILE_IDAT in FIG. 8A) that is periodically fluctuated. The monitoring circuit 500 may monitor the frequency modulation on the input data signal IDAT, and may generate a monitoring result signal MS.

The code signal generator 300b may generate a first compensation code signal CPCODE' based on the second start signal ACC_START and the monitoring result signal MS provided from the monitoring circuit 500. The first compensation code signal CPCODE' may be used to compensate for the frequency modulation on the plurality of reference clock signals RCLK and the frequency modulation on the input data signal IDAT.

The code signal generator 300b may include a table 310 and a table accumulator 320b. The table 310 may store the raw data RD1, and the table accumulator 320b may generate the first compensation code signal CPCODE' based on the monitoring result signal MS and raw data RD1. For example, the table 310, e.g., the raw data RD1 stored in the table 310 may be updated based on the monitoring result signal MS.

The clock data recovery circuit 100b based on the phase interpolation according to example embodiments may include the code signal generator 300b and the monitoring circuit 500. Accordingly, the clock data recovery circuit 100b may have the function of canceling the self-generated frequency modulation component and may also have a function of canceling the frequency modulation component provided from the outside, and may have relatively improved or enhanced performance.

Referring to FIG. 10, a clock data recovery circuit 100c includes a phase locked loop 200c, a code signal generator 300c and a clock and data generator 400a.

The clock data recovery circuit 100c may be substantially the same as the clock data recovery circuit 100a of FIG. 3, except that configurations of the phase locked loop 200c and the code signal generator 300c are partially changed.

The phase locked loop 200c may generate the plurality of reference clock signals RCLK based on the first start signal SSC_START and a mode selection signal MSEL.

An operation mode may be set or selected based on the mode selection signal MSEL, and the operation mode may include a first operation mode for a normal operation and a second operation mode for a test operation. The first operation mode may be referred to as a normal mode, and the second operation mode may be referred to as a test mode.

For example, the operation mode may be set to the first operation mode based on the mode selection signal MSEL. In the first operation mode, the first start signal SSC_START may be activated, the phase locked loop 200c may generate the plurality of reference clock signals RCLK of which the frequencies are modulated, and each of the plurality of reference clock signals RCLK may have the first profile. For another example, the operation mode may be set to the second operation mode based on the mode selection signal MSEL. In the second operation mode, the first start signal SSC_START may be deactivated, the phase locked loop 200c may generate the plurality of reference clock signals RCLK of which the frequencies are not modulated, and each of the plurality of reference clock signals RCLK may have a fixed frequency.

The code signal generator 300c may generate the first compensation code signal CPCODE or a first code signal TCODE based on the second start signal ACC_START and the mode selection signal MSEL. The first compensation code signal CPCODE may be generated in the first operation mode and may be used to compensate for the frequency modulation on the plurality of reference clock signals RCLK. The first code signal TCODE may be generated in the second operation mode and may be used to test the characteristics of the clock data recovery circuit 100c. For example, as with the first compensation code signal CPCODE, the first code signal TCODE may be a digital code and may be referred to as a test code. The first code signal TCODE may have a fourth profile that is periodically fluctuated and is different from the first profile and the second profile.

The code signal generator 300c may include a first table 310, a second table 315, a multiplexer 330 and a table accumulator 320c.

The first table 310 may be substantially the same as the table 310 in FIG. 3. The second table 315 may store raw data RD2 used to generate the first code signal TCODE.

The multiplexer 330 may output one of the raw data RD1 and the raw data RD2 based on the mode selection signal MSEL. For example, the multiplexer 330 may output the raw data RD1 in the first operation mode, and may output the raw data RD2 in the second operation mode.

The table accumulator 320c may generate the first compensation code signal CPCODE based on the second start signal ACC_START and the raw data RD1 in the first operation mode, and may generate the first code signal TCODE based on the second start signal ACC_START and the raw data RD2 in the second operation mode.

In some example embodiments, when the table accumulator 320c is implemented as illustrated in FIG. 5, the table accumulator 320c may generate the first compensation code signal CPCODE using both of the table accumulators 321 and 323 in the first operation mode, and may generate the first code signal TCODE using only one table accumulator (e.g., the second table accumulator 323) in the second operation mode.

The phase interpolator 410 may generate the clock signal CLK based on the plurality of reference clock signals RCLK having the first profile and the first compensation code signal CPCODE having the second profile in the first operation mode, and may generate the clock signal CLK based on the plurality of reference clock signals RCLK of which the frequencies are not modulated and the first code signal TCODE having the fourth profile in the second operation mode. The test operation may be performed based on the clock signal CLK in the second operation mode.

In some example embodiments, the clock data recovery circuit 100c may further include the monitoring circuit 500 in FIG. 9.

Figure 11A:
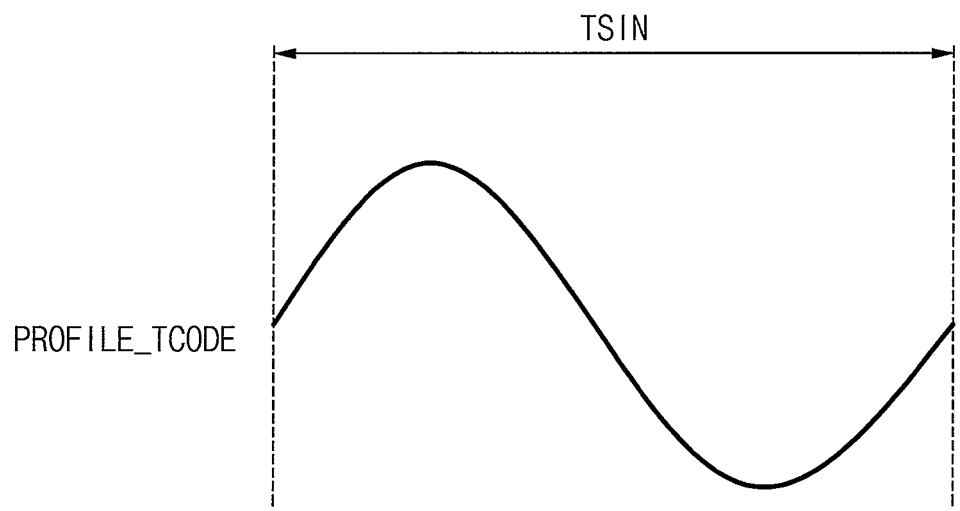
FIGS. 11A and 11B are diagrams for describing an operation of a clock data recovery circuit of FIG. 10.
Figure 11B:
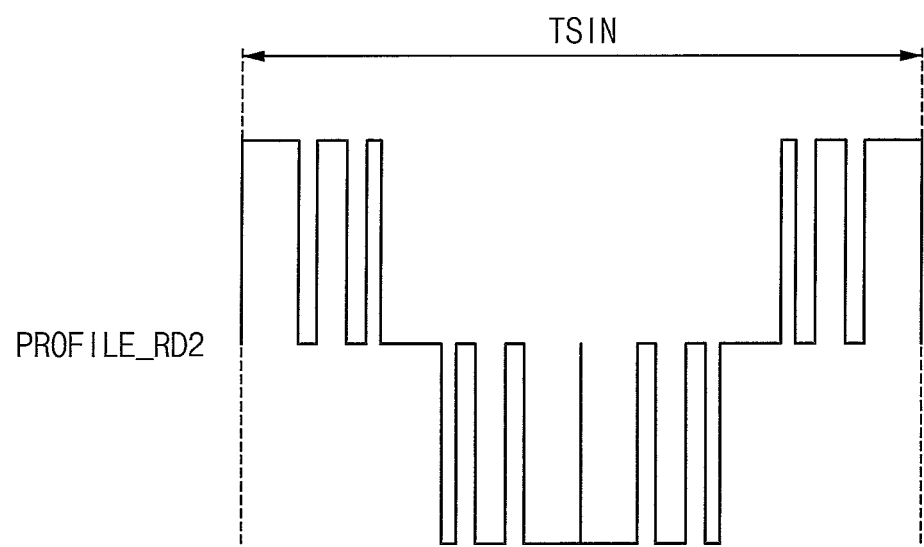

FIGS. 11A and 11B are diagrams for describing an operation of a clock data recovery circuit of FIG. 10.

FIG. 11A illustrates a fourth profile PROFILE_TCODE for the first code signal TCODE that is generated from the code signal generator 300c in the second operation mode. FIG. 11B illustrates a profile PROFILE RD2 for the raw data RD2 that is provided from the second table 315 included in the code signal generator 300c.

Referring to FIGS. 11A and 11B, the fourth profile PROFILE_TCODE may correspond to a sinusoidal waveform, and may have a waveform that is regularly repeated for each unit interval TSIN. In addition, to generate the first code signal TCODE having the fourth profile PROFILE_TCODE, the raw data RD2 may have the profile PROFILE RD2 illustrated in FIG. 11B.

In some example embodiments, the first code signal TCODE may correspond to a sinusoidal jitter used in the test operation, and a built-in jitter tolerance (JTOL) measurement may be performed based on the first code signal TCODE. In this example, the sinusoidal jitter may be generated using the second table 315 having a relatively simple configuration, an additional configuration for generating the sinusoidal jitter may not be required, and thus the test operation may be efficiently performed and the test efficiency may be improved.

Figure 12:
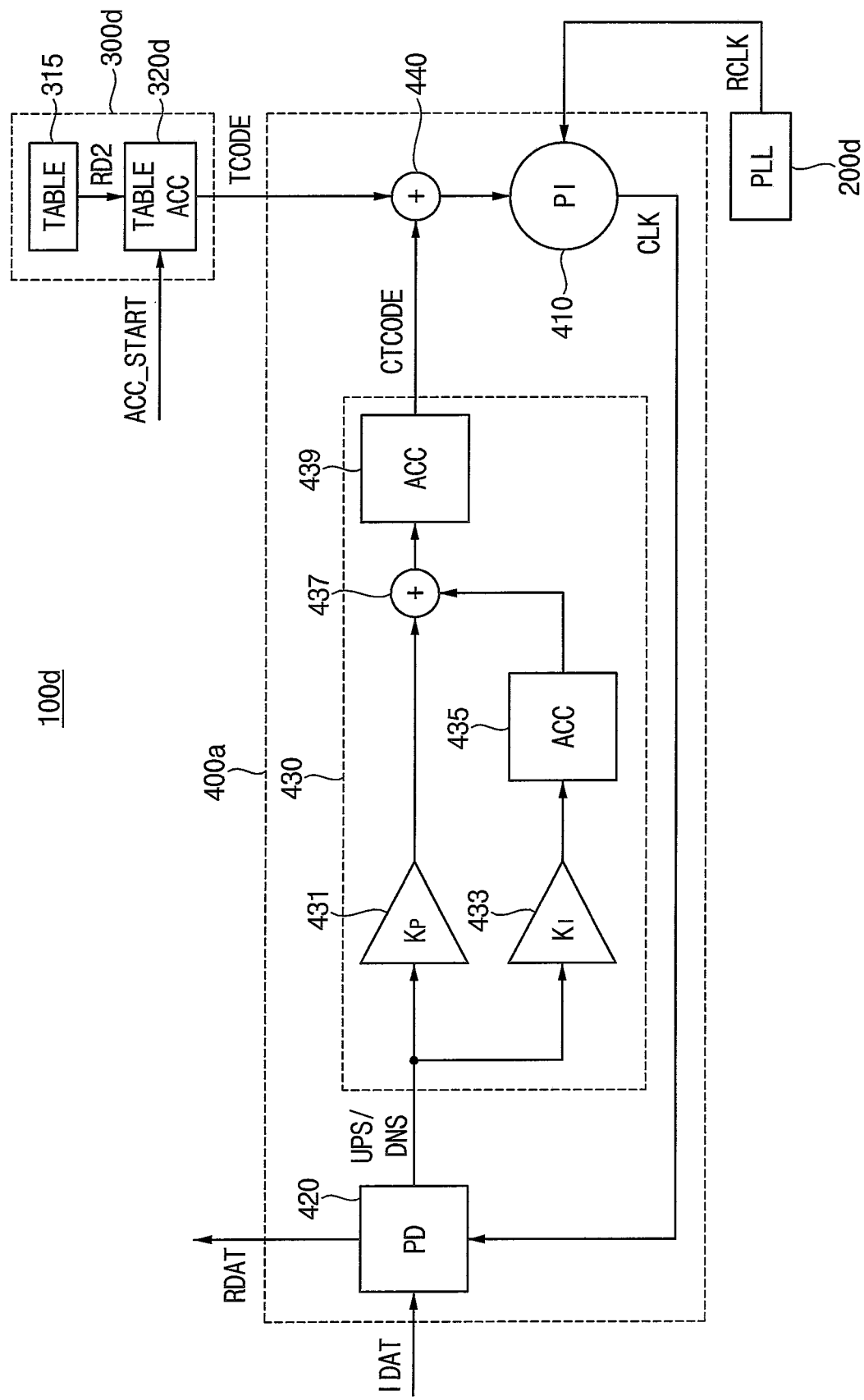
FIG. 12 is a block diagram illustrating another example of a clock data recovery circuit of FIG. 1.

FIG. 12 is a block diagram illustrating another example of a clock data recovery circuit of FIG. 1. The descriptions repeated with FIG. 10 will be omitted.

Referring to FIG. 12, a clock data recovery circuit 100d includes a phase locked loop 200d, a code signal generator 300d and a clock and data generator 400a.

The clock data recovery circuit 100d may be substantially the same as the clock data recovery circuit 100c of FIG. 10, except that configurations of the phase locked loop 200d and the code signal generator 300d are partially changed.

The clock data recovery circuit 100d may be implemented to perform only the operation in the second operation mode of the clock data recovery circuit 100c of FIG. 10. The phase locked loop 200d may generate the plurality of reference clock signals RCLK of which the frequencies are not modulated. The code signal generator 300d may generate the first code signal TCODE based on the second start signal ACC_START. The code signal generator 300d may include a table 315 and a table accumulator 320d that are substantially the same as the second table 315 and the table accumulator 320c in FIG. 10, respectively.

Figure 13:
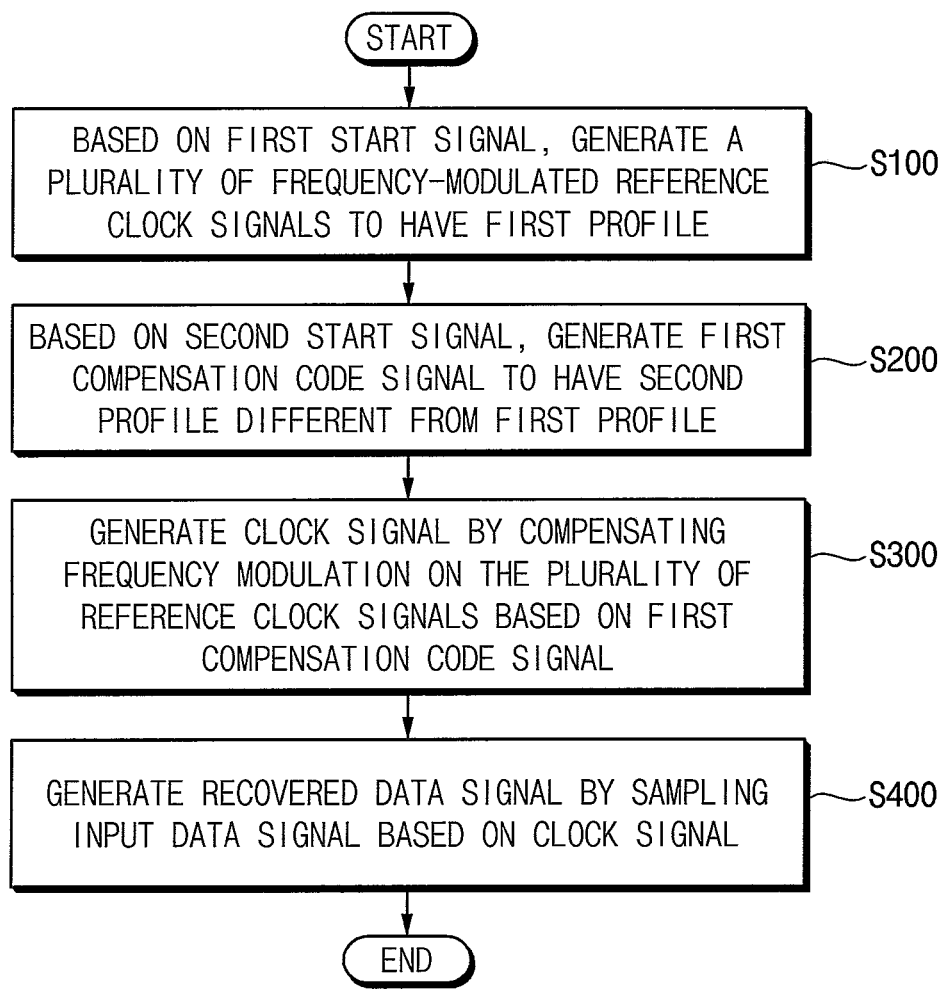
FIG. 13 is a flowchart illustrating a clock data recovery method according to example embodiments.

FIG. 13 is a flowchart illustrating a clock data recovery method according to example embodiments.

Referring to FIGS. 1 and 13, in a clock data recovery method according to example embodiments, based on the first start signal SSC_START, the plurality of reference clock signals RCLK of which the frequencies are modulated are generated to have the first profile that is periodically fluctuated (step S100). For example, step S100 may be performed by the phase locked loop 200, and the first profile may be implemented as illustrated in FIG. 2A.

Based on the second start signal ACC_START, the first compensation code signal CPCODE is generated to have the second profile that is periodically fluctuated and is different from the first profile (step S200). For example, step S200 may be performed by the code signal generator 300, and the second profile may be implemented as illustrated in FIG. 2B. A detailed process of step S200 may be substantially the same as that described with reference to FIGS. 3, 4, 5, 6A, 6B and 6C.

The phase interpolation is performed based on the plurality of reference clock signals RCLK, and the clock signal CLK is generated by compensating for the frequency modulation on the plurality of reference clock signals RCLK based on the first compensation code signal CPCODE (step S300). For example, step S300 may be performed by the phase interpolator 410 included in the clock and data generator 400, and the profile for the clock signal CLK may be implemented as illustrated in FIG. 2C. In other words, the frequency modulation component self-generated by the phase locked loop 200 may be canceled.

The recovered data signal RDAT is generated by sampling the input data signal IDAT based on the clock signal CLK (step S400). For example, step S400 may be performed by the clock and data generator 400.

In some example embodiments, the operation of monitoring the frequency modulation on the input data signal IDAT and the operation of generating the first compensation code signal CPCODE' based thereon may be additionally performed, as described with reference to FIG. 9. "The monitoring circuit forms a second frequency control loop and may be implemented in conventional manner based on a frequency counter, a second reference clock, and an integrator." In other example embodiments, the operation of selecting the operation mode based on the mode selection signal MSEL and the operation of generating the first compensation code signal CPCODE or the first code signal TCODE based on the operation mode may be additionally performed, as described with reference to FIG. 10.

As will be appreciated by those skilled in the art, embodiments include a system, method, computer program product, and/or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain or store a program for use by or in connection with an instruction execution system, apparatus, or device. For example, the computer readable medium may be a non-transitory computer readable medium.

Figure 14:
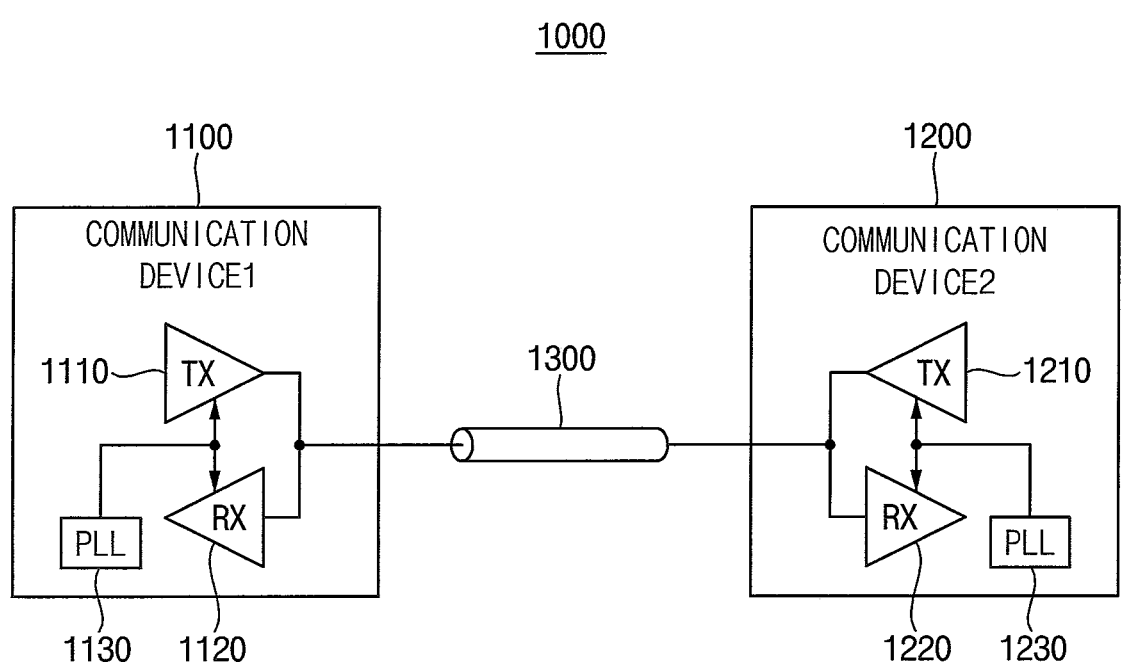
FIG. 14 is a block diagram illustrating a communication device and a communication system including the communication device according to example embodiments.

FIG. 14 is a block diagram illustrating a communication device and a communication system including the communication device according to example embodiments.

Referring to FIG. 14, a communication system 1000 includes a first communication device 1100, a second communication device 1200 and a channel 1300.

The first communication device 1100 includes a first transmitter (TX) 1110, a first receiver (RX) 1120 and a first phase locked loop 1130. The second communication device 1200 includes a second transmitter 1210, a second receiver 1220 and a second phase locked loop 1230. The first transmitter 1110 and the first receiver 1120 are connected to the second transmitter 1210 and the second receiver 1220 through the channel 1300. In some example embodiments, each of the first and second communication devices 1100 and 1200 may include a plurality of transmitters and a plurality of receivers, and the communication system 1000 may include a plurality of channels for connecting the plurality of transmitters and the plurality of receivers.

The first transmitter 1110 generates and outputs a data signal to be transmitted to the second communication device 1200, and the second receiver 1220 receives the data signal provided through the channel 1300. Similarly, the second transmitter 1210 generates and outputs a data signal to be transmitted to the first communication device 1100, and the first receiver 1120 receives the data signal provided through the channel 1300. The first phase locked loop 1130 generates reference clock signals provided to the first transmitter 1110 and the first receiver 1120, and the second phase locked loop 1230 generates reference clock signals provided to the second transmitter 1210 and the second receiver 1220. In other words, the first phase locked loop 1130 may be shared by the first transmitter 1110 and the first receiver 1120, and the second phase locked loop 1230 may be shared by the second transmitter 1210 and the second receiver 1220. The first communication device 1100 and/or the second communication device 1200 may perform a target operation (e.g., an operation to be performed or executed) based on the received data signal.

Each of the receivers 1120 and 1220 may include the clock data recovery circuit according to example embodiments, and may perform a clock data recovery method according to example embodiments. In other words, each of the receivers 1120 and 1220 may be implemented to have a function of canceling the frequency modulation component self-generated by the phase locked loops 1130 and 1230.

Embodiments may be applied to various electronic devices and systems that include the clock data recovery circuits and the communication devices. For example, embodiments may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A clock data recovery circuit based on phase interpolation, the clock data recovery circuit comprising:
   a phase locked loop (PLL) configured to generate a plurality of reference clock signals of which frequencies are modulated based on a first start signal, each of the plurality of reference clock signals having a first profile that is periodically fluctuated;
   a code signal generator configured to generate a first compensation code signal based on a second start signal, the first compensation code signal having a second profile that is periodically fluctuated and is different from the first profile; and
   a clock and data generator configured to generate a recovered data signal by sampling an input data signal according to a clock signal, and to compensate a frequency modulation on the plurality of reference clock signals based on the first compensation code signal, and
   wherein the clock and data generator includes a phase interpolator configured to generate the clock signal based on the plurality of reference clock signals and the first compensation code signal.

2. The clock data recovery circuit of claim 1, wherein:
   the first profile corresponds to a first frequency modulation with a first triangular waveform,
   the second profile corresponds to a second frequency modulation with a second triangular waveform, and
   the first profile and the second profile have opposite shapes.

3. The clock data recovery circuit of claim 2, wherein:
   the first profile has a first waveform that is regularly repeated for each unit interval,
   the second profile has a second waveform that is regularly repeated for each unit interval, the first waveform increases with a first slope in a first interval of the unit interval and decreases with a second slope in a second interval of the unit interval, and the second waveform decreases with the second slope in the first interval and increases with the first slope in the second interval.

4. The clock data recovery circuit of claim 2, wherein each of the first profile and the second profile is provided based on spread spectrum clocking (SSC).

5. The clock data recovery circuit of claim 1, wherein the code signal generator includes:

a table configured to store raw data used to generate the first compensation code signal; and a table accumulator configured to generate the first compensation code signal based on the second start signal and the raw data.

6. The clock data recovery circuit of claim 5, wherein the table accumulator includes:

a first table accumulator configured to accumulate the raw data; and a second table accumulator configured to generate the first compensation code signal by accumulating an output of the first table accumulator.

7. The clock data recovery circuit of claim 5, wherein the table includes at least one of a first value corresponding to a first slope in an increasing interval of the second profile and a second value corresponding to a second slope in a decreasing interval of the second profile.

8. The clock data recovery circuit of claim 7, wherein the table further includes interval information corresponding to a first length of the increasing interval and a second length of the decreasing interval.

9. The clock data recovery circuit of claim 5, wherein:

the clock data recovery circuit is configured to receive a simultaneous activation of the first start signal and the second start signal, and the PLL and the table accumulator are configured to simultaneously start to generate the plurality of reference clock signals and the first compensation code signal based on the simultaneous activation.

10. The clock data recovery circuit of claim 5, wherein:

when the first start signal is activated at a first time point, the PLL is configured to generate the plurality of reference clock signals at the first time point based on the first start signal, and when the second start signal is activated at a second time point after the first time point, the table accumulator is configured to start to generate the first compensation code signal at the second time point based on the second start signal.

11. The clock data recovery circuit of claim 1, wherein the clock and data generator further includes:

a phase detector configured to generate the recovered data signal by sampling the input data signal based on the clock signal, and to generate an up signal and a down signal representing a phase difference between the input data signal and the clock signal;

a filtering circuit configured to generate a control code signal based on the up signal and the down signal; and a first adder configured to sum the control code signal and the first compensation code signal, and wherein the phase interpolator is configured to compensate the frequency modulation on the plurality of reference clock signals based on an output of the first adder.

12. The clock data recovery circuit of claim 11, wherein the filtering circuit includes:

a first filter configured to filter the up signal and the down signal;

a second filter configured to filter the up signal and the down signal;

a first accumulator configured to accumulate an output of the second filter;

a second adder configured to sum an output of the first filter and an output of the first accumulator; and a second accumulator configured to generate the control code signal by accumulating an output of the second adder.

13. The clock data recovery circuit of claim 1, wherein:

the input data signal of which a frequency is modulated is provided, the input data signal has a third profile that is periodically fluctuated and is different from the first profile and the second profile, and the clock data recovery circuit further includes:

a monitoring circuit configured to monitor a third frequency modulation on the input data signal.

14. The clock data recovery circuit of claim 13, wherein the code signal generator is configured to generate the first compensation code signal further based on an output of the monitoring circuit.

15. The clock data recovery circuit of claim 1, wherein:

the code signal generator is configured to generate a first code signal based on the second start signal, and the first code signal has a fourth profile that is periodically fluctuated and is different from the first profile and the second profile, and the phase interpolator is configured to generate the clock signal based on the plurality of reference clock signals and the first code signal.

16. The clock data recovery circuit of claim 15, wherein the code signal generator is configured:

to generate the first compensation code signal in a first operation mode for a normal operation, and to generate the first code signal in a second operation mode for a test operation.

17. The clock data recovery circuit of claim 16, wherein the PLL is configured to:

generate the plurality of reference clock signals of which the frequencies are modulated to have the first profile based on the first start signal that is activated in the first operation mode, and generate the plurality of reference clock signals of which the frequencies are not modulated based on the first start signal that is deactivated in the second operation mode.

18. A communication device comprising:

a clock data recovery circuit configured to receive an input data signal provided through a communication channel, wherein the clock data recovery circuit includes:

a phase locked loop (PLL) configured to generate a plurality of reference clock signals of which frequencies are modulated based on a first start signal, each of the plurality of reference clock signals having a first profile that is periodically fluctuated;

a code signal generator configured to generate a first compensation code signal based on a second start signal, the first compensation code signal having a second profile that is periodically fluctuated and is different from the first profile; and a clock and data generator configured to generate a recovered data signal by sampling the input data signal according to a clock signal, and to compensate a frequency modulation on the plurality of reference clock signals based on the first compensation code signal, and wherein the clock and data generator includes a phase interpolator configured to generate the clock signal based on the plurality of reference clock signals and the first compensation code signal.

19. The communication device of claim 18, further comprising:

a transmitter configured to generate an output data signal provided through the communication channel, and wherein the PLL is shared by the clock data recovery circuit and the transmitter.

20. A clock data recovery circuit based on phase interpolation comprising:

a phase locked loop (PLL) configured to generate a plurality of reference clock signals of which frequencies are modulated based on a first start signal, each of the plurality of reference clock signals having a first profile that is periodically fluctuated;

a code signal generator configured to generate a first compensation code signal based on a second start signal, the first compensation code signal having a second profile that is periodically fluctuated and is different from the first profile; and a clock and data generator configured to generate a recovered data signal by sampling an input data signal based on a clock signal, wherein the code signal generator includes:

a table configured to store raw data used to generate the first compensation code signal; and a table accumulator configured to generate the first compensation code signal based on the second start signal and the raw data, wherein the clock and data generator includes:

a phase detector configured to generate an up signal and a down signal representing a phase difference between the input data signal and the clock signal;

a filtering circuit configured to generate a control code signal based on the up signal and the down signal;

an adder configured to sum the control code signal and the first compensation code signal; and a phase interpolator configured to generate the clock signal based on the plurality of reference clock signals and an output of the adder, wherein the phase interpolator is configured to compensate a first frequency modulation on the plurality of reference clock signals based on the output of the adder, wherein the first profile corresponds to a second frequency modulation with a first triangular waveform, and has a first waveform that is regularly repeated for each unit interval, the second profile corresponds to a third frequency modulation with a second triangular waveform, and has a second waveform this is regularly repeated for each unit interval, wherein the first profile and the second profile have opposite shapes, wherein the first waveform increases with a first slope in a first interval of the unit interval and decreases with a second slope in a second interval of the unit interval, and wherein the second waveform decreases with the second slope in the first interval and increases with the first slope in the second interval.

* * * * *